United States Patent [19]

Tanaka et al.

[11] Patent Number: 5,357,059
[45] Date of Patent: Oct. 18, 1994

[54] CONSTRUCTION OF ELECTRICAL CONNECTION TO OXIDE SUPERCONDUCTOR

[75] Inventors: Saburo Tanaka; Hideo Itozaki; Hidenori Nakanishi, all of Hyogo, Japan

[73] Assignee: Sumitomo Electric Industries, Ltd., Osaka, Japan

[21] Appl. No.: 545,618

[22] Filed: Jun. 29, 1990

[30] Foreign Application Priority Data

Jun. 29, 1989 [JP] Japan .................................. 1-167570

[51] Int. Cl.$^5$ .................................. H01B 12/00
[52] U.S. Cl. .................................. 505/220; 174/94 R; 505/706; 505/925
[58] Field of Search .................. 174/15.4, 15.5, 125.1; 505/1, 706, 856, 926, 927, 925, 833; 365/160, 161; 204/192.24

[56] References Cited

U.S. PATENT DOCUMENTS

| | | | |
|---|---|---|---|
| 4,837,609 | 6/1989 | Gurvitch et al. | 505/1 |
| 4,971,948 | 11/1990 | Dam et al. | 505/1 |
| 5,019,551 | 5/1991 | Hidaka | 505/1 |
| 5,079,223 | 1/1992 | Maroni | 505/1 |

FOREIGN PATENT DOCUMENTS

| | | | |
|---|---|---|---|
| 0167910 | 7/1989 | Japan | 505/706 |
| 0065007 | 3/1990 | Japan | 174/15.4 |

OTHER PUBLICATIONS

"Low-resistivity contacts to bulk high $T_c$ superconductors", *Applied Physics Letter*, vol. 54, No. 25, New York, Jun. 19, 1989, pp. 2605–2607.

"Electrical Contact to Superconductors", *IEEE Transactions on Components, Hybrids, and Manufacturing Technology*, vol. 12, No. 1, New York, Mar. 1989, pp. 21–31.

"Low resistance ohmic contacts to high-$T_c$ superconducting thin films", *IEEE Transactions on Magnetics*, vol. 25, No. 2, Mar. 1989, pp. 2049–2052.

"A Simple Method for Attaching Electrical Leads to Small Samples of High-$T_c$ Oxides", *Japanese Journal of Applied Physics*, vol. 27, No. 4, Tokyo, Apr. 1988, pp. 658–660.

"Gold contacts on superconducting crystals on $YBa_2Cu_3O_7$ with very low contact resistivity", *Applied Physics Letters*, vol. 55, No. 18, New York, Oct. 30, 1989, pp. 1912–1914.

*Primary Examiner*—Leo P. Picard
*Assistant Examiner*—Bot L. Ledynh
*Attorney, Agent, or Firm*—Foley & Lardner

[57] ABSTRACT

An electrical connection between an electric conductor and an oxide superconductor is effected without the intermediary of a thin insulating layer that is formed by leaving the oxide superconductor in the atmosphere. This electrical connection is formed by removing the thin insulating layer that is formed by leaving the oxide superconductor in the atmosphere, and by electrically connecting the electric conductor and an exposed surface of the oxide superconductor.

12 Claims, 2 Drawing Sheets

CONSTRUCTION OF ELECTRICAL CONNECTION TO OXIDE SUPERCONDUCTOR

BACKGROUND OF THE INVENTION

1. Field of the Invention

The present invention relates to a method and a construction of electric connection to an oxide superconductor, and more specifically to an electrical connection to an oxide superconductor which can be effectively implemented in a superconductor device using an oxide superconductor thin film.

2. Description of Related Art

Superconductor devices using an oxide superconductor thin film have been expected to be an oxide superconductor product which will be reduced to practice first. In general, most of this type superconductor devices use the oxide superconductor in the form of a thin film. In this case, an oxide superconductor portion of the superconductor device has to be connected to an internal or external normal conductor. However, a connection technique for this purpose has not yet been established. Some of researchers have tried to squeeze a drop of indium (In) onto a surface of the oxide superconductor so as to bring the drop of indium into electric contact to the oxide superconductor, and then, to connect a leading wire through the drop of indium to the oxide superconductor.

When the oxide superconductor thin film is exposed to the atmosphere, a surface of the superconductor thin film is deteriorated due to moisture contained in the atmosphere and other factors. More specifically, if the oxide superconductor is left in the atmosphere, a very thin insulating layer will be formed on a surface of the oxide superconductor in contact with the atmosphere. Therefore, if a connection wire is led directly from the surface of the oxide superconductor, an ohmic contact having a sufficiently low resistance cannot be obtained due to a contact resistance through the very thin insulating layer on the oxide superconductor. As the result, a characteristics of the superconductor device cannot be fully utilized.

SUMMARY OF THE INVENTION

Accordingly, it is an object of the present invention to provide an electrical connection to an oxide superconductor which overcomes the above mentioned defect and which has a sufficiently low contact resistance.

These and other objects of the present invention are achieved in accordance with the present invention by an electrical connection formed by connecting an electrical conductor to an oxide superconductor, wherein the electrical connection between the electrical conductor and the oxide superconductor is effected without the intermediary of a thin insulating layer that is formed by leaving the oxide superconductor in the atmosphere.

According to another aspect of the present invention, there is provided a method for electrically connecting an electric conductor connected to an oxide superconductor, wherein an electrical connection between the electrical conductor and the oxide superconductor is formed after removing a thin insulating layer that is formed by leaving the oxide superconductor in the atmosphere.

In a preferred embodiment, in order to form the electrical connection between the electrical conductor and the oxide superconductor without the intermediary of the thin insulating layer that is formed by leaving the oxide superconductor in the atmosphere, a contact hole is perforated in the oxide superconductor, and the electrical conductor is electrically connected to the oxide superconductor in the contact hole. This contact hole preferably has a diameter in the range of 10 $\mu$m to 3 mm. If the diameter of the contact hole is smaller than 10 $\mu$m, a satisfactory connection cannot be established, and if the diameter of the contact hole is larger than 3 mm, the connection portion becomes too large and therefore is not practical. In addition, an inner face of the contact hole is preferably coated with a conductive metal, and the electrical conductor is also preferably connected to the conductive metal coating with a conductive paste.

In general cases, a surface of an oxide superconductor thin film used in a superconductor device is exposed to the atmosphere, and therefore, as mentioned hereinbefore, is deteriorated due to moisture contained in the atmosphere and other factors. However, the inside of the oxide superconductor thin film is maintained in a good condition. Therefore, a good ohmic contact can be obtained by perforating a contact hole in the oxide superconductor thin film and connecting the electric conductor to a portion of the oxide superconductor exposed at an inner surface of the contact hole.

The oxide superconductor has anisotropy in coherence length which is indicative of superconductivity, and the coherence length in a c-axis direction is about one-tenth of that in an a-axis or b-axis direction. Namely, the oxide superconductor is weak in superconductivity in the c-axis direction. Therefore, the oxide superconductor thin film having the c-axis perpendicular to a substrate or a plane of the thin film is difficult to form a good electrical contact at or along the surface of the thin film. However, if a hole is formed in the oxide superconductor thin film having the c-axis perpendicular to the substrate and an electrical contact is formed at a side or section of the oxide superconductor thin film namely in a direction perpendicular to the c-axis direction, an electrically good ohmic contact can be established due to a so-called proximity effect resulting from a strong superconductivity in the a-axis or b-axis direction. The contact hole is preferably formed by a mechanical machining, but can be formed in a chemical or physical process by using a photolithography.

In the present invention, it is significant that an electrical connection between an electrical conductor and an oxide superconductor is effected without the intermediary of a thin insulating layer that is formed by leaving the oxide superconductor in the atmosphere. Therefore, a formation of the contact hole is not indispensable, but rather, merely one non-limitative example which makes it possible to form the electrical connection between the electrical conductor and the oxide superconductor without the intermediary of a thin insulating layer that is formed by leaving the oxide superconductor in the atmosphere. In place of forming the contact hole, it is possible to form a groove on the superconductor, or etch an edge of the superconductor so as to form a connection on a clean surface having no thin insulating layer that is formed by leaving the oxide superconductor in the atmosphere.

In the method in accordance with the present invention, if the contact hole is formed, it is preferred to coat an inner surface of the contact hole with a conductive metal. This conductive metal coating is not necessarily indispensable, but is very effective in obtaining a good connection characteristics. The conductive metal coating can be deposited by well-known coating processes such as vacuum evaporation or sputtering. The conductive metal coating can be formed of a material having less reactivity to the oxide superconductor and having a high electrical conductivity, for example, Ag, Au, In, Zn, Cu, Ni, Pt, Ti, Pb, and Pd.

The conductive paste used for fixing the electrical conductor to the conductive metal coating may be a paste of Ag, In, Cu, Au, Pt, Ai, and Pb or can be formed of a single metal selected from a group consisting of the above listed metals. If the single metal is used, a relative soft metal such as Ag, In or Pb is preferred. For example, if a conductive paste consisting of In is used, a baking is performed for one hour at 300° C. If a conductive paste consisting of Ag is used, a baking is performed for one hour at 500° C. The use of the conductive paste is not indispensable, and can be replaced by a ultrasonic bonding which connects or bonds the electrical conductor directly to the conductive metal coating.

The above and other objects, features and advantages of the present invention will be apparent from the following description of preferred embodiments of the invention with reference to the accompanying drawings.

DESCRIPTION OF THE PREFERRED EMBODIMENTS

Figure 1:
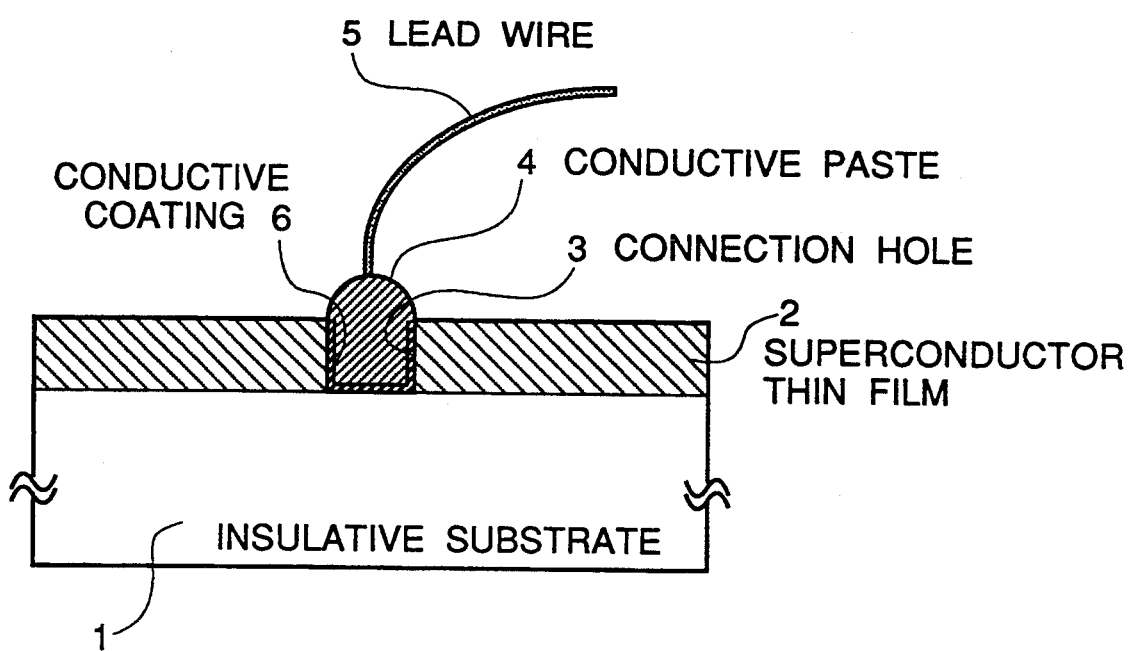
FIG. 1 is a diagrammatic sectional view illustrating a structure of electrical connection to an oxide superconductor in accordance with the present invention.

Referring to FIG. 1, there is diagrammatically illustrated a structure of electrical connection to an oxide superconductor in accordance with the present invention.

In the shown structure of electrical connection, a contact hole 3 is perforated in an oxide superconductor thin film 2 formed on a substrate 1, and conductive lead wire 5 is connected to the oxide superconductor thin film 2 in the contact hole 3. More specifically, in order to reduce a contact resistance, an inner surface of the contact hole 3 is covered with coating 6 formed of a metal having a high electric conductivity, and the lead wire 5 is fixed within the contact hole 3 by a conductive paste 4.

In examples explained hereinafter, a contact resistance in the structure of electrical connection to the oxide superconductor was measured by using a so-called "three-terminal method" and a so-called "four-terminal method" in combination.

Figure 2A:
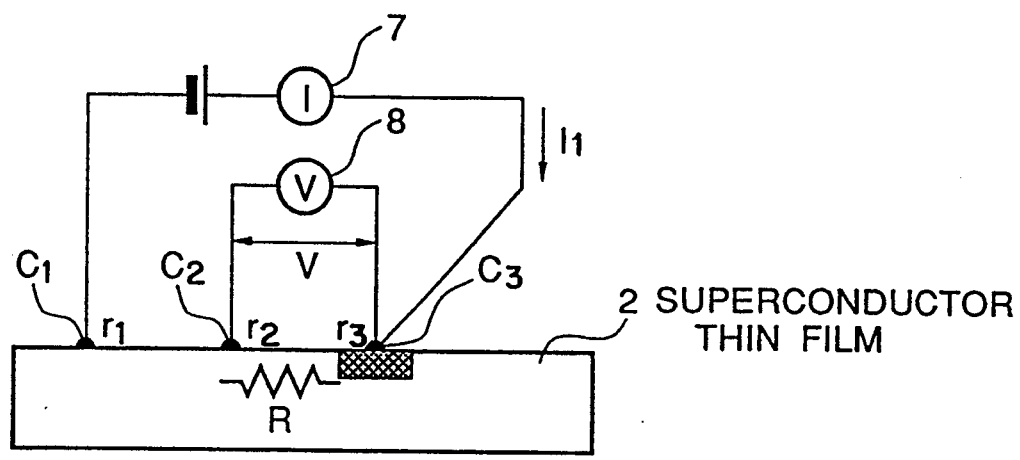
FIGS. 2A and 2B illustrate a method of measuring a contact resistance in the structure of electrical connection to the oxide superconductor.
Figure 2B:
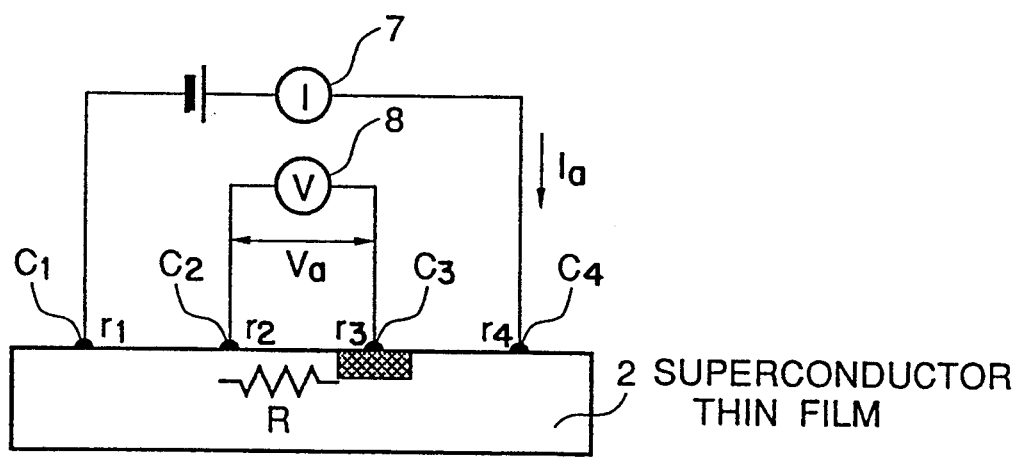

First, as illustrated in FIG. 2A, conventional electrical connections $C_1$ and $C_2$ and an electrical connection $C_3$ in accordance with the present invention are formed on the superconductor thin film 2. An electric current I is flowed between the connections $C_1$ and $C_3$ and is measured by an ammeter 7. On the other hand, a voltmeter 8 is connected between the connections $C_2$ and $C_3$ so that an electric voltage V between the connections $C_2$ and $C_3$ is measured by the voltmeter 8. Here, it is assumed that contact resistances at the connections $C_1$, $C_2$ and $C_3$ are $r_1$, $r_2$ and $r_3$, respectively, and an equivalent resistance in a portion of the superconductor thin film 2 between the connections $C_2$ and $C_3$ is R. It is also assumed that an internal impedance of the voltmeter 8 is infinite.

Under the above mentioned arrangement, the voltmeter 8 measures a voltage drop V occurring when the current I flows in series through the equivalent resistance R of the superconductor thin film 2 and the contact resistance $r_3$. Therefore, $$r_3 = (V/I) - R \quad (1)$$

Furthermore, a conventional electrical connection $C_4$ is formed on the superconductor thin film 2. An electric current Ia is flowed between the connections $C_1$ and $C_4$ and is measured by the ammeter 7. On the other hand, an electric voltage Va between the connections $C_2$ and $C_3$ is measured by the voltmeter 8. Here, it is assumed that a contact resistance at the connection $C_4$ is $r_4$.

In this case, the voltmeter 8 measures a voltage drop Va occurring when the current Ia flows in series through only the equivalent resistance R of the superconductor thin film 2. Therefore, $$Va = Ia \cdot R \quad (2)$$

Accordingly, the following equation can be derived from the above equations (1) and (2).

$$r_3 = (V/I) - (Va/Ia) \quad (3)$$

Thus, the contact resistance $r_3$ in the structure of electrical connection $C_3$ to the oxide superconductor in accordance with the present invention can be measured by a sequential measurement of the "three-terminal method" and the "four-terminal method", without being influenced by values of $r_1$, $r_2$ and $r_4$, and R.

EXAMPLE 1

A thin film of $Y_1Ba_2Cu_3O_x$ ($6 < x \leq 7$) was formed on a monocrystalline substrate of MgO (100) by sputtering, and was patterned to form a superconductor circuit having a width of 100 μm a length of 10 mm. Thereafter, a connection structure as shown in FIG. 1 was formed by using an Au wire, and thereafter, a contact resistance was measured.

The contact hole 3 of 50 μm m in diameter was mechanically perforated by pushing a sharp tip end of a diamond pen to the oxide superconductor thin film. Thereafter, Au was deposited by a vacuum evaporation so that the coating layer 6 of 3000 Å is formed.

The condition of the vacuum evaporation is as follows:

| Heating of the substrate | No heating |
|---|---|
| Degree of vacuum | 1 to 3 × $10^{-6}$ torr |
| Deposition rate | 5 to 10 Å/second |

Thereafter, a paste of In was physically squeezed to the contact hole 3 and an Au wire of 50 μm in diameter was connected thereto.

As a comparative example, a similar Au wire is connected to a superconductor circuit which was formed similarly to the above mentioned superconductor circuit, and a contact resistance was measured. The result is shown in the following Table 1.

TABLE 1

|  | Comparative | Invention |
|---|---|---|
| Contact resistance ($\Omega$ cm$^2$) | $7 \times 10^{-9}$ | $4 \times 10^{-10}$ |

(The contact resistance was measured at 77.3K)

It would be seen that the electrical connection in accordance with the present invention improves the contact resistance more than one order of magnitude, in comparison with the conventional one.

EXAMPLE 2

A thin film of $Y_1Ba_2Cu_3O_x$ ($6 < x \leq 7$) was formed on a monocrystalline substrate of MgO (100) by sputtering, and was patterned to form a superconductor circuit having a width of 100 μm and a length of 10 mm. Thereafter, a connection structure as shown in FIG. 1 was formed by using an Au wire, and thereafter, a contact resistance was measured.

The contact hole 3 of 50 μm in diameter was perforated by forming a necessary pattern on the oxide superconductor thin film circuit by photolithography, and then, by etching by use of a Kaufman type ion gun. Thereafter, Au was deposited by a vacuum evaporation under the same condition as in the Example 1 so that the coating layer 6 of 3000 Å is formed.

Thereafter, an Au wire of 50 μm in diameter was connected in the same manner as in the Example 1.

As a comparative example, a similar Au wire is connected to a superconductor circuit which was formed similarly to the above mentioned superconductor circuit, and a contact resistance was measured. The result is shown in the following Table 2.

TABLE 2

|  | Comparative | Invention |
|---|---|---|
| Contact resistance ($\Omega$ cm$^2$) | $5 \times 10^{-9}$ | $6 \times 10^{-10}$ |

(The contact resistance was measured at 77.3K)

It would be seen that the above example in accordance with the present invention improves the contact resistance about one order of magnitude, in comparison with the conventional one.

EXAMPLE 3

A thin film of $Bi_2Sr_2Ca_2Cu_3O_y$ ($7 \leq y \leq 10$) was formed on a monocrystalline substrate of MgO (100) by sputtering, and was patterned to form a superconductor circuit having a width of 100 μm and a length of 10 mm. Thereafter, a connection structure as shown in FIG. 1 was formed by using an Au wire, and thereafter, a contact resistance was measured.

Similarly to the Example 2, the contact hole 3 of 50 μm in diameter was perforated by forming a necessary pattern on the oxide superconductor thin film circuit by photolithography, and then, by etching by use of a Kaufman type ion gun. Thereafter, Au was deposited by a vacuum evaporation under the same condition as in the Example 1 so that the coating layer 6 of 3000 Å is formed.

Thereafter, an Au wire of 50 μm in diameter was connected in the same manner as in the Example 1. In addition, as a comparative example, a similar Au wire is connected to a superconductor circuit which was formed similarly to the above mentioned superconductor circuit, and a contact resistance was measured. The result is shown in the following Table 3.

TABLE 3

|  | Comparative | Invention |
|---|---|---|
| Contact resistance ($\Omega$ cm$^2$) | $6 \times 10^{-9}$ | $5 \times 10^{-10}$ |

(The contact resistance was measured at 77.3K)

It would be seen that similarly to the Example 1, the above example in accordance with the present invention improves the contact resistance more than one order of magnitude, in comparison with the conventional one.

EXAMPLE 4

A thin film of $Tl_1Ba_2Ca_2Cu_3O_z$ ($7 \leq z \leq 10$) was formed on a monocrystalline substrate of MgO (100) by sputtering, and was patterned to form a superconductor circuit having a width of 100 μm and a length of 10 mm. Thereafter, a connection structure as shown in FIG. 1 was formed by using an Au wire, and thereafter, a contact resistance was measured.

Similarly to the Example 2, the contact hole 3 of 50 μm in diameter was perforated by forming a necessary pattern on the oxide superconductor thin film circuit by photolithography, and then, etching by use of a Kaufman type ion gun. Thereafter, Au was deposited by a vacuum evaporation under the same condition as in the Example 1 so that the coating layer 6 of 3000 Å is formed.

Thereafter, an Au wire of 50 μm in diameter was connected in the same manner as in the Example 1. In addition, as a comparative example, a similar Au wire is connected to a superconductor circuit which was formed similarly to the above mentioned superconductor circuit, and a contact resistance was measured. The result is shown in the following Table 4.

TABLE 4

|  | Comparative | Invention |
|---|---|---|
| Contact resistance ($\Omega$ cm$^2$) | $8 \times 10^{-9}$ | $7 \times 10^{-10}$ |

(The contact resistance was measured at 77.3K)

It would be seen that similarly to the Example 1, the above example in accordance with the present invention improves the contact resistance more than one order of magnitude, in comparison with the conventional one.

As seen from the above explanation, the contact resistance to the oxide superconductor is greatly decreased in the electrical connection in accordance with the present invention between the electrical conductor and the oxide superconductor. Therefore, a heating loss in the connection portion is minimized, and also, a reliability of the connection portion is increased.

The invention has thus been shown and described with reference to the specific embodiments. However, it should be noted that the present invention is in no way limited to the details of the illustrated structures but changes and modifications may be made within the scope of the appended claims.

We claim:
1. A superconductor circuit comprising:
   an oxide superconductor layer overlying a support;
   a contact hole perforated only in said oxide superconductor layer; and an electrical conductor wire connected to said oxide superconductor layer at a portion of said oxide superconductor exposed on an inner surface of said contact hole.

2. A superconductor circuit as claimed in claim 1, wherein said oxide superconductor layer is an oxide superconductor thin film which has a c-axis perpendicular to a plane of said oxide superconductor thin film, and wherein said superconductor circuit additionally comprises an insulator layer on which said superconductor thin film is formed.

3. A superconductor circuit as claimed in claim 1, wherein said oxide superconductor layer is an oxide superconductor thin film formed of $Y_1Ba_2Cu_3O_x$, ($6<x\leq7$) $Bi_2Sr_2Ca_2Cu_3O_y$ ($7\leq y\leq10$) or $Tl_2Ba_2Ca_2Cu_3O_z$ ($7\leq z\leq10$).

4. A superconductor circuit as claimed in claim 3, wherein said inner surface of said contact hole is coated with a conductive metal and said electrical conductor wire is connected to said conductive metal coating.

5. A superconductor circuit as claimed in claim 1, wherein said electrical conductor wire is connected to said oxide superconductor layer without the intermediary of a thin insulating film.

6. A superconductor circuit comprising:
an oxide superconductor layer;
a contact hole in said oxide superconductor; and
an electrical conductor connected to said oxide superconductor at a portion of said oxide superconductor exposed on an inner surface of said contact hole wherein said inner surface of said contact hole is coated with a conductive metal and said electrical conductor is connected to said conductive metal coating.

7. A superconductor circuit as claimed in claim 6, wherein said conductive metal coating is formed of one material selected from a group consisting of Ag, Au, In, Zn, Cu, Ni, Pt, Ti, Pb and Pd.

8. A superconductor circuit as claimed in claim 6, wherein said electrical conductor is formed of Au.

9. A superconductor circuit as claimed in claim 6, wherein said electrical conductor is connected to said conductive metal coating through a conductive paste.

10. A superconductor circuit as claimed in claim 9, wherein said conductive paste is formed of one material selected from a group consisting of Ag, In, Cu, Au, Pt, Al and Pb.

11. A superconductor circuit comprising:
an oxide superconductor thin film which overlies a support and which has a c-axis perpendicular to a plane of said oxide superconductor thin film;
a contact hole perforated only in said oxide superconductor thin film; and
an electrical conductor wire connected to said oxide superconductor at a portion of said oxide superconductor thin film exposed on an inner side surface of said contact hole, said inner side surface of said contact being oriented in an a-axis direction or b-axis direction.

12. A superconductor circuit comprising:
an oxide superconductor layer overlying a support;
a photolithographically-defined pattern of contact holes perforated in said oxide superconductor layer; and
electrical conductor wires connected to said oxide superconductor at portions of said oxide superconductor layer exposed on an inner surface of said contact holes.

* * * * *